United States Patent [19]

Takasu

[11] Patent Number: 5,518,953
[45] Date of Patent: * May 21, 1996

[54] METHOD FOR MANUFACTURING SEMICONDUCTOR DEVICE HAVING GROWN LAYER ON INSULATING LAYER

[75] Inventor: Hidemi Takasu, Kyoto, Japan

[73] Assignee: Rohm Co., Ltd., Kyoto, Japan

[*] Notice: The portion of the term of this patent subsequent to Mar. 22, 2011, has been disclaimed.

[21] Appl. No.: 213,429

[22] Filed: Mar. 15, 1994

Related U.S. Application Data

[62] Division of Ser. No. 804,576, Dec. 10, 1991, Pat. No. 5,326,991.

[30] Foreign Application Priority Data

Sep. 24, 1991 [JP] Japan ................................. 3-243507

[51] Int. Cl.$^6$ .................................................. H01L 21/20
[52] U.S. Cl. ............................ 437/106; 437/126; 117/95; 117/913; 117/923; 117/951
[58] Field of Search .......................... 117/95, 913, 923, 117/951; 437/106, 126

[56] References Cited

U.S. PATENT DOCUMENTS

| | | |
|---|---|---|
| 3,508,980 | 4/1970 | Jackson, Jr. et al. . |
| 4,760,036 | 7/1988 | Schubert ................................. 437/90 |
| 4,772,927 | 9/1988 | Saito et al. . |
| 4,902,637 | 2/1990 | Kondou et al. . |
| 4,983,538 | 1/1991 | Gotou . |
| 4,997,787 | 3/1991 | Eshita . |
| 5,028,976 | 7/1991 | Ozaki et al. . |
| 5,296,086 | 3/1994 | Takasu . |
| 5,308,445 | 5/1994 | Takasu ................................. 117/90 |

FOREIGN PATENT DOCUMENTS

| | | |
|---|---|---|
| 62-188373 | 8/1987 | Japan . |
| 2-213141 | 8/1990 | Japan . |
| 2-267197 | 10/1990 | Japan . |
| 2-291123 | 11/1990 | Japan . |
| 2-278818 | 11/1990 | Japan . |
| 2-296799 | 12/1990 | Japan . |

OTHER PUBLICATIONS

"Lateral Epitaaxial Overgrowth of Silicon on SiO$_2$", by D. D. Rathman et al, Journal Of Electro–Chemical Society Solid–State Science And Technology, Oct., 1982, p. 2303.
"New SOI–Selective Nucleation Epitaxy" by Ryudai Yoinehara et al, Preliminary Bulletin for the 48th Fall Academic Lecture 1987 by the Applied Physics Society, 19p–Q–15, p. 583.
Chaudry et al., "Fabrication and properties of polycrystalline–SiC/Si structures for Si Heterojunction Devices", Applied Physics Letters, vol. 59, No. 1, Jul. 1991, pp. 51–53.

*Primary Examiner*—R. Bruce Breneman
*Assistant Examiner*—Linda J. Fleck
*Attorney, Agent, or Firm*—Lowe, Price, LeBlanc & Becker

[57] ABSTRACT

A semiconductor device is manufactured by forming an epitaxial layer (22) insulated from a silicon substrate (2), and forming a device in the epitaxial layer (22). On the semiconductor substrate (2), a silicon dioxide layer (4) is formed (FIG. 2A). Then the silicon dioxide layer (4) is provided with openings (14) (FIG. 2D). Silicon carbide is grown until it protrudes from the openings (14) to thereby form a silicon carbide seed crystal layer (16) (FIG. 2E). Next, oxidation is carried out, allowing a field oxide layer (20) to be connected at the portion under the openings (14) and the silicon carbide seed crystal layer (16) to be insulated from the silicon substrate (2). Thereafter, epitaxial growth is effected from the silicon carbide seed crystal layer (16). The growth is stopped before silicon grown layers (22) connect to one another, thus obtaining epitaxially grown layers (22) having regions which are separate from one another. The MOS device is formed in this epitaxially grown layer (22). The silicon carbide grown layer (22) is isolated from the silicon substrate (2) and formed as regions isolated from one another, having a uniform plane bearing. Accordingly, the layer (22) causes no electrostatic capacitance due to the absence of a pn junction with the silicon substrate (2) or with an adjacent layer (22), allowing high-speed operation of the device. Moreover, the unique plane bearing facilitates control during the manufacturing process.

10 Claims, 6 Drawing Sheets

METHOD FOR MANUFACTURING SEMICONDUCTOR DEVICE HAVING GROWN LAYER ON INSULATING LAYER

This application is a division of application Ser. No. 07/804,576, filed Dec. 10, 1991, now U.S. Pat. No. 5,826, 991.

BACKGROUND OF THE INVENTION

1. Field of the Invention

The present invention relates to methods for manufacturing semiconductor devices and, more particularly, to structures having a semiconductor layer on an insulating layer.

2. Description of the Prior Art

Semiconductor microchips or integrated circuits in general are provided in a structure in which an epitaxially grown layer is formed on a silicon substrate, and circuits are then formed in the epitaxially grown layer. The silicon substrate and the epitaxially grown layer are joined together to form a pn junction. The resulting capacitance of the pn junction, however, is such that it reduces the operating speed of the device. Accordingly, this structure is not suitable for forming devices requiring high-speed operation.

In the last few years, to solve this problem, a way of forming an additional silicon monocrystal layer to overlie an insulating layer on the silicon substrate (Semiconductor on Insulator, or SOI, technique) has been sought. This is to eliminate the pn junction between the semiconductor device formed on the silicon monocrystal layer and the silicon substrate, by insulating the silicon monocrystal layer from the silicon substrate.

FIG. 1 illustrates the conventional SOI technique using the ELO (Epitaxial Lateral Overgrowth) method as described in "Lateral Epitaxial Overgrowth of Silicon on SiO$_2$," by D. D. Rathman et. al., JOURNAL OF ELECTROCHEMICAL SOCIETY SOLID-STATE SCIENCE AND TECHNOLOGY, October, 1982, p. 2303. First, a silicon dioxide layer 4 is grown on top of a semiconductor substrate 2. Then, the silicon dioxide layer 4 is etched using photoresist to thereby open seed windows 6 (see FIG. 1A). This is followed by selective epitaxial growth of silicon in the longitudinal direction from the seed windows 6 and, subsequently, lateral epitaxial growth, to form an epitaxial layer 8 on the silicon dioxide layer 4 (see FIG. 1B). By these processes, the pn junction between the epitaxial layer 8 and the silicon substrate 2 can be reduced in area to the size of the seed window 6, thus allowing the pn junction capacitance to be reduced and high-speed operation of the device to be realized.

Another method available is the SENTAXY method which is disclosed in "New SOI-Selective Nucleation Epitaxy," by Ryudai Yonehara et. al., Preliminary Bulletin for the 48th Fall Academic Lecture 1987 by the Applied Physics Society, 19p-Q-15, p. 583. In this method, a plurality of crystal-grown silicon nuclei are formed on an insulating layer of silicon dioxide or the like, further effecting epitaxial growth from each of the nuclei. Methods of forming the nuclei include formation of a small-area silicon nitride layer composed of the nuclei, or employment of the FIB (Focused Ion Beam) method. Using this method, the epitaxial layer and the silicon substrate may be isolated from one another by an oxide layer, which will solve the aforementioned problems.

However, the conventional SOI technique described above has the following disadvantages.

In the ELO method shown in FIG. 1, the junction, although reduced, is not wholly eliminated. This would arrest further increase of the operating speed of the device.

In the SENTAXY method, on the other hand, the epitaxial layer and the silicon substrate are isolated from one another, thus overcoming the ELO method disadvantages. However, the SENTAXY method involves differentiation in the plane bearing of the epitaxial layer that grows from each of the nuclei. This differentiation in the plane bearing of the epitaxial layer causes variation in oxidation rate and other characteristics, with the result that a device having desired characteristics cannot be formed uniformly.

SUMMARY OF THE INVENTION

An object of the present invention, therefore, is to overcome the aforementioned problems and disadvantages and provide a semiconductor device having a grown layer which is isolated from the substrate by an insulating layer and uniform in plane bearing.

The present invention provides, in a first embodiment, a method for manufacturing a semiconductor device having a grown layer on an insulating layer, comprising:

an insulating layer formation step of forming an oxide insulating layer on a silicon substrate;

an opening formation step of providing the oxide insulating layer with an opening for seed crystal growth;

a seed crystal growth step of effecting crystal growth until the silicon carbide seed crystal layer protrudes from the opening with the oxide insulating layer used as a mask;

a selective oxidation step of oxidizing the silicon substrate under the opening with the silicon carbide seed crystal layer used as a barrier, thereby cutting off the connection between the silicon carbide seed crystal layer and the silicon substrate;

a silicon carbide growth step of subjecting the silicon carbide to crystal growth on the basis of the silicon carbide seed crystal layer, to thereby obtain regions of the silicon carbide grown layer separated from one another; and a device formation step of forming a semiconductor device on the silicon carbide grown layer.

In another embodiment, a method for manufacturing a semiconductor device having a grown layer on an insulating layer comprises:

an insulating layer formation step of forming an oxide insulating layer on a silicon substrate;

an opening formation step of providing the oxide insulating layer with an opening for seed crystal growth;

a seed crystal growth step of effecting crystal growth until the silicon carbide seed crystal layer protrudes from the opening with the oxide insulating layer used as a mask;

an oxide insulating layer removal step of removing the oxide insulating layer a selective oxidation step of oxidizing the silicon substrate under the opening with the silicon carbide seed crystal layer used as a barrier, thereby cutting off the connection between the silicon carbide seed crystal layer and the silicon substrate;

a silicon carbide growth step of subjecting the silicon carbide to crystal growth on the basis of the silicon carbide seed crystal layer, to thereby obtain regions of the silicon carbide grown layer separated from one another; and a device formation step of forming a semiconductor device on the silicon carbide grown layer.

Also provided is a complementary MOS device which is formed in the silicon carbide grown layer isolated from the silicon substrate, formed as regions isolated from one another, and has a uniform plane bearing.

While the novel features of the invention are set forth in a general fashion, particularly in the appended claims, the invention, both as to organization and content, will be better understood and appreciated, along with other objects and features thereof, from the following detailed description taken in conjunction with the drawings.

DESCRIPTION OF THE PREFERRED EMBODIMENT

Figure 1A:
FIGS. 1A and 1B are views illustrating the conventional SOI (Semiconductor on Insulator) technique using the ELO (Epitaxial Lateral Overgrowth) method.
Figure 1B:
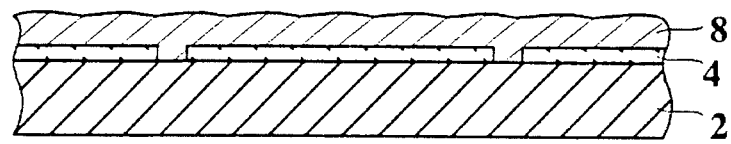
Figure 2A:
FIGS. 2A–2E are views illustrating a method for manufacturing a semiconductor device which is an embodiment of the present invention.
Figure 2B:
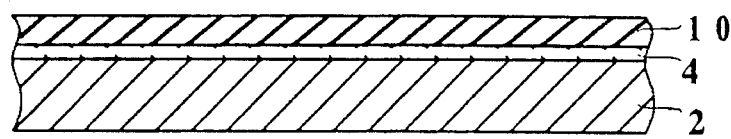
Figure 2C:
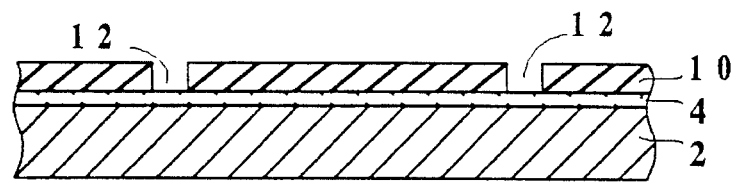
Figure 2D:
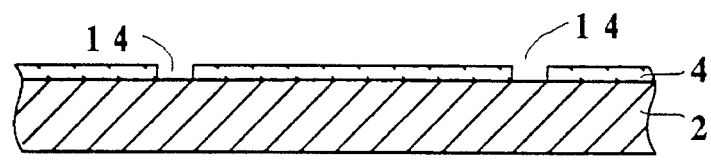

A method for manufacturing a semiconductor device according to a first embodiment of the present invention is shown in FIGS. 2A–2E. First, a silicon substrate 2 is placed in an oxygen atmosphere, with temperature increased to high, thereby thermally oxidizing the substrate surface. As a result, a silicon dioxide layer 4 ($SiO_2$) serving as an oxide insulating layer is formed on the top of the silicon substrate 2, as shown in FIG. 2A. Preferably, the silicon dioxide layer is formed thin, for example, approximately 30 to 300 nm thick. Next, as shown in FIG. 2B, photoresist 10 is applied onto the silicon dioxide layer 4. After a mask is placed on the photoresist 10 and exposed to ultraviolet rays, openings 12 are formed, as shown in FIG. 2C. In this state, with the photoresist 10 used as a mask, the silicon dioxide layer 4 is subjected to etching. Subsequently, the photoresist 10 is removed by use of a mixed liquid of sulfuric acid and hydrogen peroxide. Thus, openings 14 for seed crystal growth are formed, as shown in FIG. 2D. The width of the openings 14 is preferably less than 2 µm.

In the step shown in FIG. 2D, the surface of the silicon substrate 2 exposed at the area of opening 14 is carbonized. Carbonization is intended to reduce the lattice inconsistency between the silicon substrate 2 and the seed crystal layer 16 (3C-SiC) at the next step of growing a silicon carbide layer, that is, to provide a buffer layer by carbonizing the surface of the silicon substrate 2.

Figure 2E:
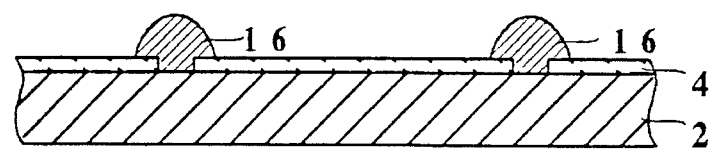

The openings 14 are then selectively subjected to epitaxial growth of silicon carbide monocrystal, so that seed crystal layers 16 are formed as shown in FIG. 2E. The epitaxial growth at this step is controlled so as to suppress lateral growth. In this embodiment, the longitudinal growth is allowed to range approximately 1 to 4 µm, while the lateral growth is suppressed to remain within 1 µm.

During growth of the seed crystal layer 16, there may arise stacking faults at the interface with the silicon dioxide layer 4. Due to this, the layer 4 of silicon dioxide is formed thin so as to reduce the interface area, as described above, to prevent stacking faults. Further, the epitaxial growth is preferably carried out at as low a temperature as possible. Moreover, when the silicon dioxide layer 4 is formed to a silicon substrate (100) in a rectangular pattern in the direction of <100>, stacking faults can be further suppressed. And still further, when a thin polysilicon or nitride silicon layer is added to the sidewall of the silicon dioxide layer 4 prior to the growth in order to improve the lattice consistency, the crystal faults can also be suppressed. Each of the seed crystal layers 16 formed by the above steps has the same plane bearing.

Figure 3:
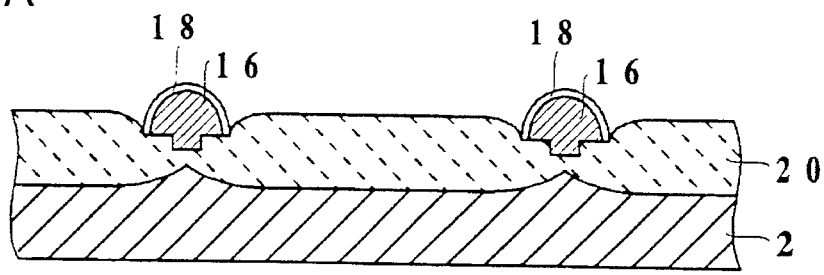
FIGS. 3A–3C show views illustrating a method for manufacturing a semiconductor device which is another embodiment of the present invention.
Figure 3:
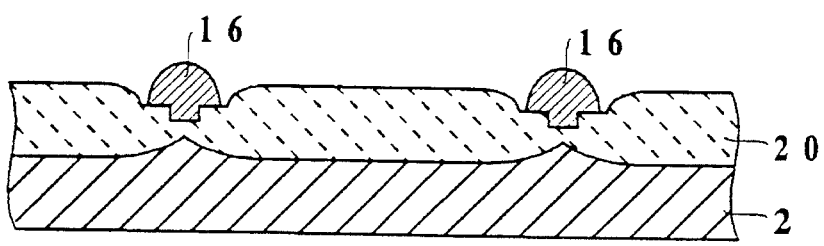
Figure 3:
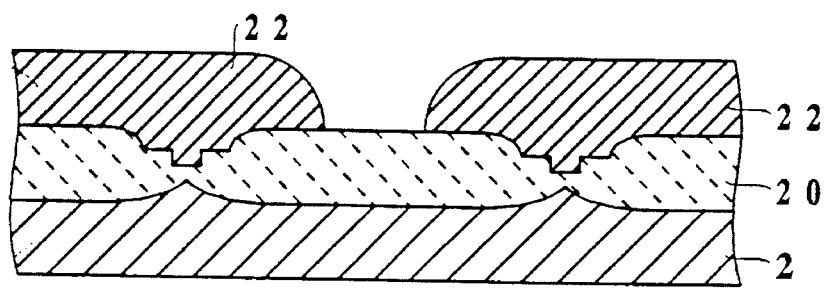

After seed crystal layer 16 growth, an oxidation treatment is performed, oxidizing the silicon dioxide layer 4 and the silicon substrate 2, to form the field oxide layer 20. The field oxide layer 20 also grows laterally at its ends (Bird's Beak phenomenon). As a result, the silicon dioxide layer 4 connects to one another under the opening 14 by the oxidation-treatment as shown in FIG. 3A.

Further, since the seed crystal layer 16 made up of silicon carbide has sufficiently low oxidation rate as compared with that of the silicon dioxide layer 4 and the silicon substrate 2, an oxide layer 18 is thinly formed only on the outside while most of the seed crystal layer 16 part remains in just the state of silicon carbide.

Incidentally, in the above oxidation treatment, the oxidation may be effected after the silicon dioxide layer 4 is removed.

Subsequently, etching is performed using buffered hydrogen fluoride or the like to remove the silicon dioxide layer 18 outside the seed crystal layer 16 (see FIG. 3B). Thereafter, epitaxial growth is effected with the silicon carbide seed crystal layers 16 used as the seed crystal. The epitaxial growth at this step is controlled so as to increase lateral growth and is stopped before the layers grown out of each seed crystal layer 16 come to be connected to one another, resulting in the structure shown in FIG. 3C.

An epitaxially grown layer 22, which is a silicon carbide grown layer, is isolated from the silicon substrate 2 by the field oxide layer 20. Accordingly, it generates no electrostatic capacitance due to the pn junction with the silicon substrate 2. This means that forming devices (e.g. transistors, FETs) in each epitaxially grown layer 22 will not cause any reduction in operating speed due to electrostatic capacitance, allowing a high-speed device to be realized. Moreover, since no electrostatic capacitance is caused due to the pn junction, a good high-frequency characteristic and an enhanced latch-up characteristic can be obtained.

Further, each epitaxially grown layer 22 is not connected to one another, thus causing no electrical isolation due to the pn junction between the layers.

In addition, the plane bearing of each seed crystal layer 16 is uniform and, therefore, that of the epitaxially grown layer 22 is also uniform. Accordingly, the oxidation rate is uniform, facilitating the control of device characteristics when forming devices in the epitaxially grown layer 22.

Figure 4:
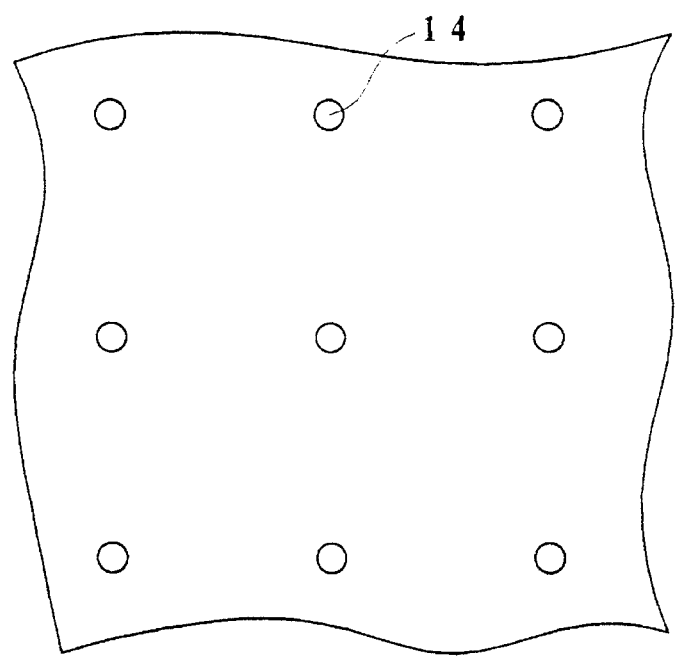
FIG. 4 is a view illustrating an example of the opening 14 provided in the oxide insulating layer 4 shown in FIG. 2D.
Figure 5:
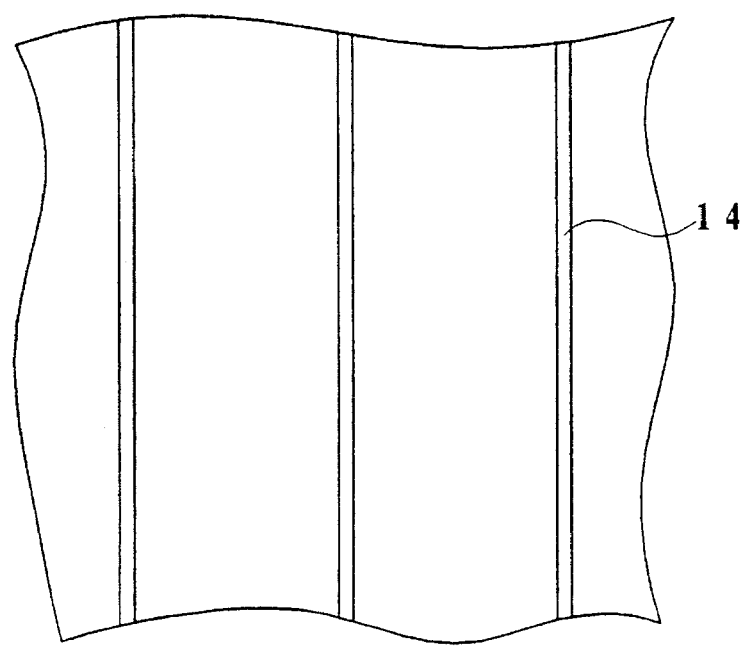
FIG. 5 is a view illustrating another example of the opening 14 provided in the oxide insulating layer 4 shown in FIG. 2D.

Further, the form of the openings 14 may be selected as appropriate to the required epitaxially grown layer 22. For example, they may be in the form of holes as shown in FIG. 4, or in lattice-like form as shown in FIG. 5. It may further be preferable that the direction of patterning the silicon dioxide layer 4 be <100>, which can prevent the occurrence of all faults.

Moreover, when the steps shown in FIGS. 2A–2E and 3A–3C are added after the formation of devices in the epitaxially grown layer 22 in FIG. 3C, integrated circuits can be formed as a three-dimensional structure.

Next, an embodiment to manufacture a MOS device according to the manufacturing method of the present invention will be explained. In this embodiment, steps extending from FIG. 2A to 2E are the same as described earlier, wherein the silicon dioxide layer 4 is formed 100 nm thick. Also, the surface of the silicon substrate 2 is carbonized by use of $C_2H_2$ (1150° C., 5 min. $H_2$ carrier gas) at the step shown in FIG. 2D before growing a seed crystal layer 16. This treatment forms a buffer layer on the surface of the silicon substrate 2, thus reducing the lattice inconsistency between silicon and silicon carbide. Thereafter, the seed crystal layer 16 is formed by growing silicon carbide (β-SiC) with the aid of $Si_2H_6$ and $C_2H_2$ (see FIG. 2E). The seed crystal layer 16 in this embodiment is grown to have a thickness of 1 μm. When inverting to N-type, $N_2$, PHOS or As serving as a dopant is added at this step.

Figure 6A:
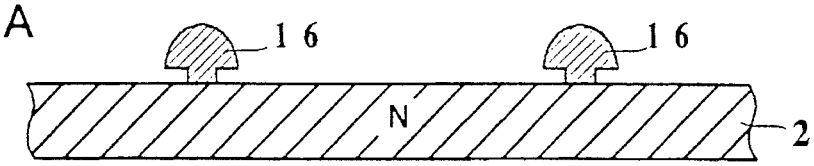
FIGS. 6A–6E show views illustrating a method for manufacturing a complementary MOS device which is an embodiment of the present invention.
Figure 6B:
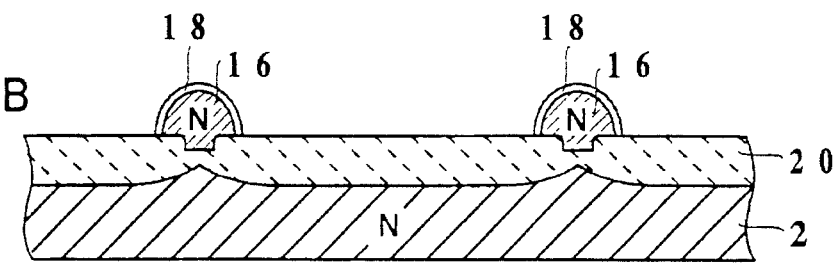

Subsequently, the silicon dioxide layer 4 is removed to thereby obtain the structure shown in FIG. 6A. In this state, oxidation is effected, which allows a field oxide layer 20 to be formed and the surface of the seed crystal layer 16 to be oxidized thinly (see FIG. 6B). When creating an impurity layer within the silicon carbide grown layer, an ion implant is carried out after the step of FIG. 6B. Ions are preferably implanted at a temperature around 600° C. with the aim at improving the activation rate of regions involved.

Figure 6C:
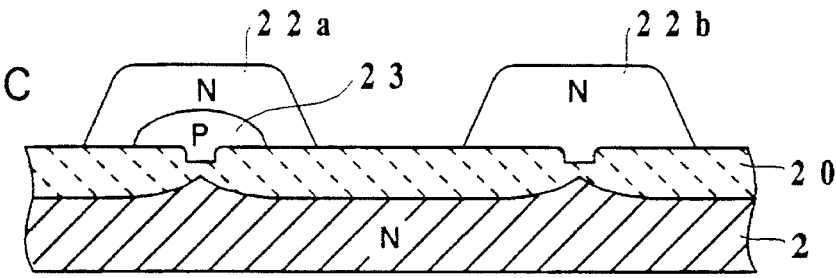

Further, after removing an oxide layer 18 outside the seed crystal layer 16, epitaxial growth of silicon carbide is carried out on the basis of the seed crystal layer 16. In this embodiment, silicon carbide is grown to be 2 μm thick by use of $Si_2H_6$ and $C_2H_2$ (1360° C., $H_2$ carrier gas, $PH_3$ dopant gas), thus obtaining epitaxially grown layers 22a and 22b, as shown in FIG. 6C, while ion-implanted seed crystal provides a P-type impurity layer 23.

Figure 6D:
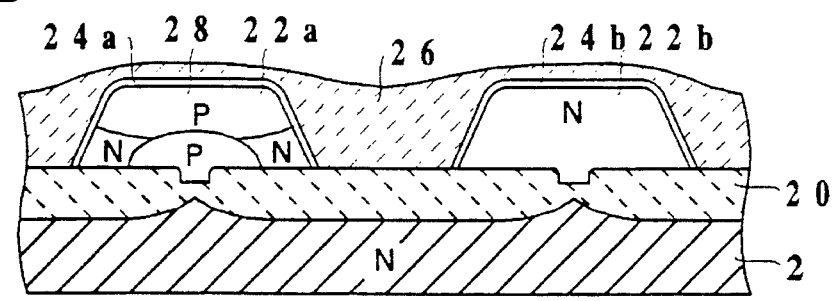

Moreover, the surface of epitaxially grown layers 22a and 22b are oxidized, thereby forming oxide layers 24a and 24b, and thereafter, an insulating layer 26 is made to grow in a region between epitaxially grown layers by SOG (Spin on Glass). The epitaxially grown layer 22a is next subjected to an ion implant step, wherein aluminum ions are implanted and then diffused to form a layer 28, resulting in the structure shown in FIG. 6D.

Since the ion diffusion step described above requires long times and high temperature, N-type impurities and P-type impurities may be independently doped at the same time while effecting the epitaxial growth of silicon carbide.

Figure 6E:
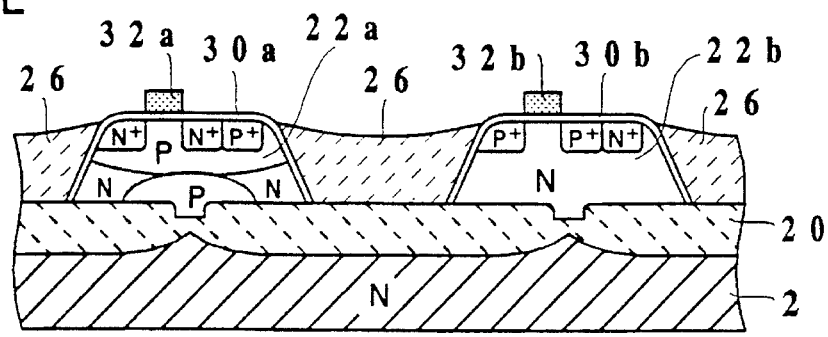

Next, oxide layers 24a, 24b and 26 on epitaxially grown layers 22a and 22b are removed by flash-etch. Gate oxide layers 30a and 30b are then formed. Further, polysilicon gates 32a and 32b are created. This is followed by the step of an ion implant and diffusion, which provides a source region and a drain region, resulting in the structure shown in FIG. 6E.

Figure 7:
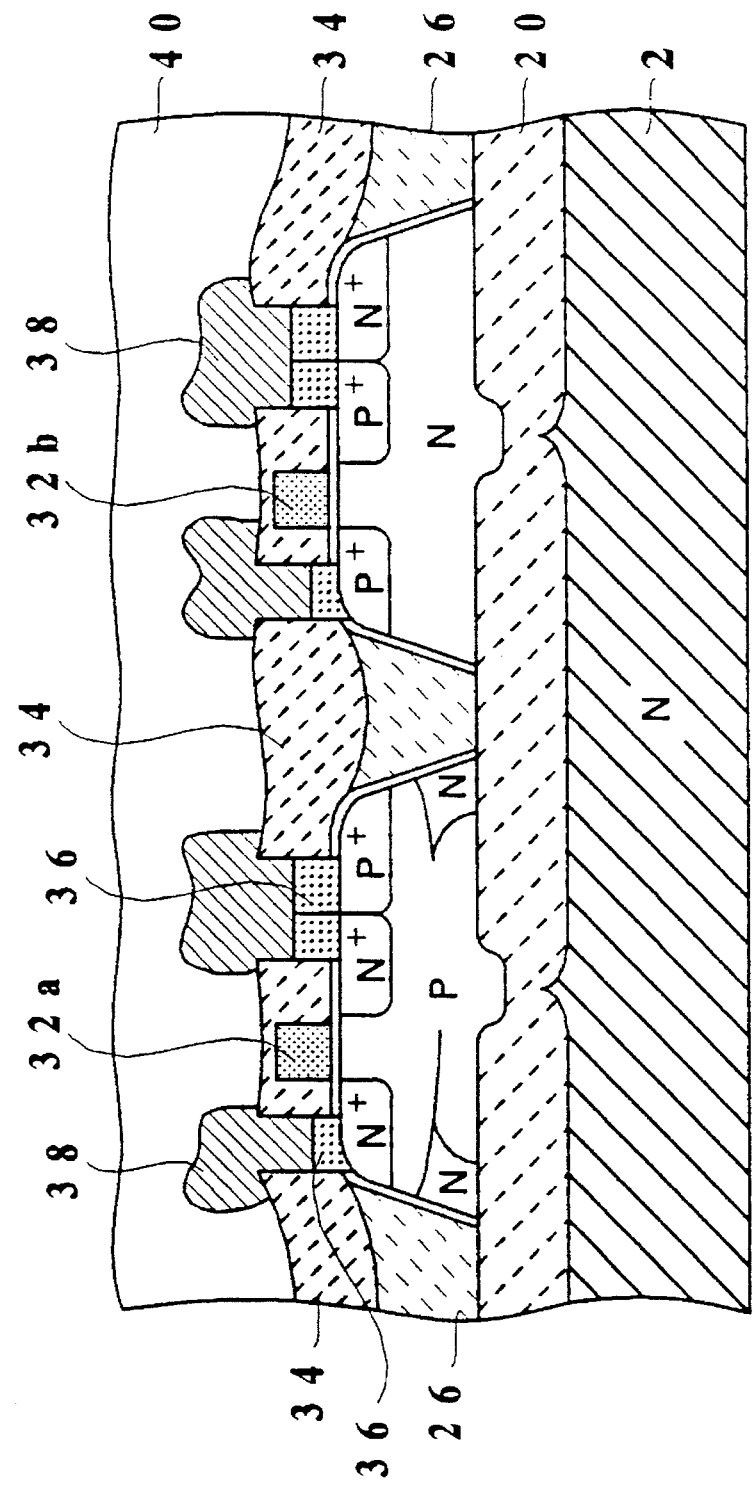
FIG. 7 is a view illustrating a structure of a complementary MOS device manufactured by the steps shown in FIGS. 6A–6E.

Thereafter, processes including formation of an insulating layer 34 using SOG and CVD (Chemical Vapor Deposition), a polysilicon contact 36 by deposition, metal wiring 38 and a protective coat 40 are performed, thus obtaining a complementary MOS and a diode, as shown in FIG. 7.

A MOS transistor in general is isolated by the LOCUS method. This method, however, is not suitable for the case where the epitaxially grown layer is made up of silicon carbide, because oxidation of silicon carbide is time-consuming as compared with that of silicon of which the oxidation rate is 10 times greater than that of silicon carbide. In the present embodiment, on the other hand, devices are formed in epitaxially grown layers 22a and 22b which are separated from one another beforehand, thereby overcoming the above-mentioned problem.

As a result, a device having excellent environment resistance (high temperature resistance, radiation resistance) characteristic of silicon carbide can be obtained easily as described above.

In the method for manufacturing a semiconductor device of the present invention, crystal growth is effected until the silicon carbide seed crystal layer protrudes from the opening of the oxide insulating layer, thus obtaining a silicon carbide seed crystal layer having the same plane bearing. Moreover, oxidation of all of the surface is carried out so that the silicon substrate under the opening is oxidized, in order to cut off the connection between the silicon carbide seed crystal layer and the silicon substrate. Subsequently, the silicon carbide grown layer, which is formed as regions isolated from one another, is grown out of the silicon carbide seed crystal layer. As a result, a silicon carbide grown layer can be obtained which is isolated from the silicon substrate, formed as regions isolated from one another, and has a uniform plane bearing. In other words, the silicon carbide grown layer can be formed without involving the pn junction with the silicon substrate, thus providing a high-speed semiconductor device. Also, the uniform plane bearing facilitates control during the formation of device components.

In the manufacturing methods of the present invention, after the opening formation step and before the seed crystal growth step, thin polysilicon layers or nitride silicon layers are formed on the oxide insulating layer of the opening sidewall. This arrangement serves to suppress any crystal faults to the opening sidewall from occurring during the crystal growth.

In the methods for manufacturing a semiconductor device of the present invention, the steps extending from insulating layer formation to device formation are repeated a specified number of times on the silicon carbide grown layer on which a semiconductor device is formed, to thereby obtain the silicon carbide grown layers insulated by a specified number of oxide insulating layers. As a result, a semiconductor device having a high degree of integration can be obtained as a three-dimensional structure.

In the methods for manufacturing a semiconductor device of the present invention, an intermediate insulating layer is provided between silicon carbide grown layers, thereby improving insulation between silicon carbide layers.

In the methods for manufacturing a semiconductor device of the present invention, the insulating layer is provided for the purpose of insulating a device from the silicon substrate. In addition, a device is formed in the silicon carbide grown layer which is formed as regions isolated from one another and uniform in the plane bearing. As a result, a MOS device thus obtained is excellent in device isolation and easy to manufacture, generating no junction capacitance during the device isolation process.

Although the invention has been described in its preferred form with a certain degree of particularity, it is understood that the present disclosure of the preferred form has been changed in the details of its construction and any combination and arrangement of parts may be resorted to without departing from the spirit and the scope of the invention as hereinafter claimed.

What is claimed is:

1. A method for manufacturing a semiconductor device having a grown layer on an insulating layer, comprising:

an insulating layer formation step of forming an oxide insulating layer on a silicon substrate;

an opening formation step of providing the oxide insulating layer with an opening for seed crystal growth;

a seed crystal growth step of effecting crystal growth until a silicon carbide seed crystal layer protrudes from said opening with the oxide insulating layer used as a mask;

a selective oxidation step of oxidizing the silicon substrate under said opening with the silicon carbide seed crystal layer used as a barrier, thereby cutting off the connection between the silicon carbide seed crystal layer and the silicon substrate;

a silicon carbide growth step of subjecting the silicon carbide to crystal growth on the basis of the silicon carbide seed crystal layer, to thereby obtain regions of the silicon carbide grown layer separated from one another; and a device formation step of forming a semiconductor device on the silicon carbide grown layer.

2. A method as claimed in claim 1, further comprising:

a step of forming a thin polysilicon layer or nitride silicon layer in the oxide insulating layer of an opening sidewall after the opening formation step and before the seed crystal growth step.

3. A method as claimed in claim 1, wherein said silicon substrate has a plane bearing of 100, so that the insulating layer is also grown with a plane bearing of 100.

4. A method as claimed in claim 1, further comprising:

an intermediate insulating layer formation step of providing an insulating layer between silicon carbide grown layers.

5. A method as claimed in claim 1, wherein the steps from said insulating layer formation step to said device formation step are repeated a specified number of times on the silicon carbide grown layer in which a semiconductor device is formed thereby to obtain a specified number of silicon carbide grown layers insulated by said oxidized insulator.

6. A method for manufacturing a semiconductor device having a grown layer on an insulating layer, comprising:

an insulating layer formation step of forming an oxide insulating layer on a silicon substrate;

an opening formation step of providing the oxide insulating layer with an opening for seed crystal growth;

a seed crystal growth step of effecting crystal growth until the silicon carbide seed crystal layer protrudes from said opening with the oxide insulating layer used as a mask;

an oxide insulating layer removal step of removing the oxide insulating layer a selective oxidation step of oxidizing the silicon substrate under said opening with the silicon carbide seed crystal layer used as a barrier, thereby cutting off the connection between the silicon carbide seed crystal layer and the silicon substrate;

a silicon carbide growth step of subjecting the silicon carbide to crystal growth on the basis of the silicon carbide seed crystal layer, to thereby obtain regions of the silicon carbide grown layer separated from one another; and a device formation step of forming a semiconductor device on the silicon carbide grown layer.

7. A method as claimed in claim 6, further comprising:

a step of forming a thin polysilicon layer or nitride silicon layer in the oxide insulating layer of an opening sidewall after the opening formation step and before the seed crystal growth step.

8. A method as claimed in claim 6, wherein said silicon substrate has a plane bearing of 100, so that the insulating layer is also grown with a plane bearing of 100.

9. A method as claimed in claim 6, further comprising:

an intermediate insulating layer formation step of providing an insulating layer between silicon carbide grown layers.

10. A method as claimed in claim 6, wherein the steps from said insulating layer formation step to said device formation step are repeated a specified number of times on the silicon carbide grown layer in which a semiconductor device is formed thereby to obtain a specified number of silicon carbide grown layers insulated by said oxidized insulator.

\* \* \* \* \*